United States Patent
Moriya et al.

(10) Patent No.: US 8,236,109 B2
(45) Date of Patent: Aug. 7, 2012

(54) COMPONENT CLEANING METHOD AND STORAGE MEDIUM

(75) Inventors: Tsuyoshi Moriya, Tokyo (JP); Akitaka Shimizu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/639,586

(22) Filed: Dec. 16, 2009

(65) Prior Publication Data

US 2010/0154821 A1 Jun. 24, 2010

(30) Foreign Application Priority Data

Dec. 18, 2008 (JP) .................................. 2008-322670

(51) Int. Cl.
*B08B 6/00* (2006.01)

(52) U.S. Cl. .......... 134/1.1; 438/905; 438/906; 15/1.51; 156/345.51; 134/22.1

(58) Field of Classification Search ........................ None
See application file for complete search history.

(56) References Cited

U.S. PATENT DOCUMENTS

| | | | |
|---|---|---|---|
| 6,205,676 B1 * | 3/2001 | Fujii et al. ........................ | 34/250 |
| 6,489,245 B1 * | 12/2002 | Winniczek et al. ............ | 438/706 |
| 2004/0084409 A1 * | 5/2004 | Deshmukh et al. ............. | 216/63 |
| 2005/0016568 A1 * | 1/2005 | Choe et al. ................. | 134/100.1 |
| 2005/0241762 A1 * | 11/2005 | Paterson et al. .......... | 156/345.28 |
| 2010/0101608 A1 | 4/2010 | Matsui et al. | |

FOREIGN PATENT DOCUMENTS

| | | |
|---|---|---|
| JP | 2008-41873 | 2/2008 |
| JP | 2010-103444 | 5/2010 |
| KR | 10-2003-0049086 | 6/2003 |

OTHER PUBLICATIONS

Popov, O.A. (1995). High Density Plasma Sources—Design, Physics and Performance.. William Andrew Publishing/Noyes. pp. 191-192.*
Office Action issued on May 4, 2011 in the corresponding Korean Patent Application No. 10-2009-0126241 (with English Translation).
Office Action issued Oct. 25, 2011 in Chinese Application No. 200910260636.9 (With English Translation).

* cited by examiner

*Primary Examiner* — Michael Barr
*Assistant Examiner* — Caitlin N Dunlap
(74) *Attorney, Agent, or Firm* — Oblon, Spivak, McClelland, Maier & Neustadt, L.L.P.

(57) ABSTRACT

A method for cleaning a component in a substrate processing apparatus including a processing chamber, foreign materials being attached to the component, at least a part of the component being exposed inside the processing chamber, and the substrate processing apparatus being adapted to load and unload a foreign material adsorbing member into and from the processing chamber. The method includes loading the foreign material adsorbing member into the processing chamber; generating a plasma nearer the component than the foreign material adsorbing member; extinguishing the plasma; and unloading the foreign material adsorbing member from the processing chamber, wherein the generation and the extinguishment of the plasma are repeated alternately and the foreign material adsorbing member has a positive potential at least during the extinguishment of the plasma.

12 Claims, 11 Drawing Sheets

COMPONENT CLEANING METHOD AND STORAGE MEDIUM

CROSS-REFERENCE TO RELATED APPLICATION

This application claims the benefit of priority to Japanese Patent Application No. 2008-322670, filed on Dec. 18, 2008, the entire contents of which are incorporated herein by reference.

FIELD OF THE INVENTION

The present invention relates to a component cleaning method and a storage medium; and, more particularly, to a component cleaning method for removing particles attached to a component of a substrate processing apparatus by a plasma.

BACKGROUND OF THE INVENTION

As for a method for cleaning a wafer for semiconductor devices after a dry etching process or the like, there is employed a wet type substrate cleaning method. This method removes foreign materials, e.g., particles, by dipping a wafer to be cleaned in solution or solvent or by spraying solvent or solution onto the wafer to be cleaned and then rinses the wafer to be cleaned with pure water if necessary.

In the wet type substrate cleaning method, the solvent or the solution may remain on a surface of the substrate after a cleaning process, which may cause watermark, surface oxidation or the like. In order to cope with such case, a spin dry process is provided to dry and remove the remaining solution, pure water or the like, after, e.g., a batch dipping process or a spraying cleaning process (see, e.g., Japanese Patent Application Publication No. 2008-41873).

In the spin dry process, when the solution, the pure water or the like is volatilized, liquid-vapor interfacial tension acts on a protruded pattern formed on a wafer surface and, thus, the pattern collapses. Further, when a wafer has a so-called low-k film, it is easy for the solution, the pure water or the like to be deposited in a porous portion of the low-k film. Once the liquid is deposited therein, it cannot be completely removed.

On the other hand, there is suggested, by the present inventors, a wafer dry cleaning method (see, e.g., Japanese Patent Application No. 2008-276027) using a cleaning apparatus including: a chamber; a mounting table provided in the chamber, for mounting and heating a wafer; and a collecting plate disposed to face the mounting table in the chamber. In this method, the chamber is depressurized and the wafer is heated to peel off particles from the wafer by thermal stress. Further, the peeled-off particles move to the collecting plate by thermophoretic force generated by a temperature gradient between the wafer and the collecting plate.

However, as the dry cleaning method is repeated, the number of particles attached to the collecting plate increases and this may lead to secondary contamination in which the particles fall from the collecting plate to be attached to the wafer. For that reason, the particles attached to the collecting plate need to be removed by cleaning the collecting plate regularly. When the collecting plate is taken out for cleaning from the cleaning apparatus, times and efforts are required. Moreover, the cleaning of the collecting plate in the chamber may cause the secondary contamination in which the particles removed from the collecting plate freely scatter in the chamber to be attached to other components in the chamber.

SUMMARY OF THE INVENTION

In view of the above, the present invention provides a component cleaning method capable of easily cleaning a component while preventing attachment of foreign materials to other components, and a storage medium.

In accordance with a first aspect of the present invention, there is provided a method for cleaning a component in a substrate processing apparatus including a processing chamber, foreign materials being attached to the component, at least a part of the component being exposed inside the processing chamber, and the substrate processing apparatus being adapted to load and unload a foreign material adsorbing member into and from the processing chamber. The method includes loading the foreign material adsorbing member into the processing chamber; generating a plasma nearer the component than the foreign material adsorbing member; extinguishing the plasma; and unloading the foreign material adsorbing member from the processing chamber. Further, in the method in accordance with the first aspect of the present invention, the generation and the extinguishment of the plasma are repeated alternately and the foreign material adsorbing member has a positive potential at least during the extinguishment of the plasma.

In accordance with a second aspect of the present invention, there is provided a computer readable storage medium storing a computer-executable program which performs a method for cleaning a component in a substrate processing apparatus including a processing chamber and a component to which foreign materials are attached, wherein the substrate processing apparatus is adapted to load and unload a foreign material adsorbing member into and from the processing chamber, and at least a part of the component is exposed inside the processing chamber. Further, the method in accordance with a second aspect of the present invention includes loading the foreign material adsorbing member into the processing chamber; generating a plasma nearer the component than the foreign material adsorbing member; extinguishing the plasma; and unloading the foreign material adsorbing member from the processing chamber. Moreover, in the method in accordance with the second aspect of the present invention, the generation and the extinguishment of the plasma are repeated alternately and the foreign material adsorbing member has a positive potential at least during the extinguishment of the plasma.

BRIEF DESCRIPTION OF THE DRAWINGS

The objects and features of the present invention will become apparent from the following description of embodiments, given in conjunction with the accompanying drawings, in which:

FIGS. 3A and 3B illustrate repetition of start and stop of surface wave plasma generation in the collecting plate cleaning process of FIG. 2, wherein FIG. 3A depict a case where the repetition is performed in a pulse wave manner.

FIGS. 4A to 4D present a modification of a foreign material adsorbing member used in the collecting plate cleaning process of FIG. 2, wherein

FIGS. 5A and 5B describe a modified process of the collecting plate cleaning process of FIG. 2, wherein

DETAILED DESCRIPTION OF THE EMBODIMENTS

Embodiments of the present invention will be described with reference to the accompanying drawings which form a part hereof.

First of all, a component cleaning method in accordance with a first embodiment of the present invention will be described.

Figure 1:
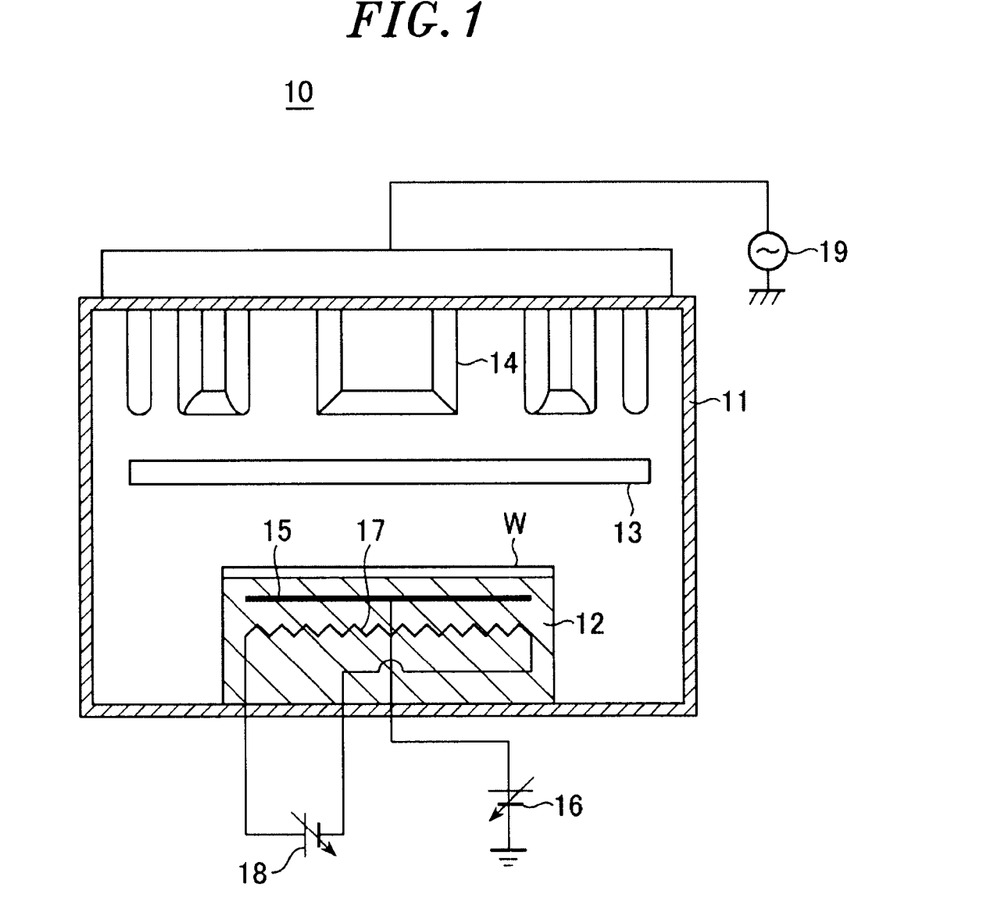
FIG. 1 is a cross sectional view schematically showing a configuration of a wafer dry cleaning apparatus for performing a component cleaning method in accordance with a first embodiment of the present invention.

FIG. 1 is a cross sectional view schematically showing a configuration of a wafer dry cleaning apparatus for performing the component cleaning method of this embodiment. The wafer dry cleaning apparatus removes foreign materials (hereinafter, referred to as "particles") attached to a surface of a semiconductor wafer (hereinafter, simply referred to as a "wafer") W without using solvent, solution or the like.

Referring to FIG. 1, a wafer dry cleaning apparatus 10 (substrate processing apparatus) includes: a processing chamber 11; a mounting table 12 provided on a bottom portion of the processing chamber 11; a collecting plate 13 (component) disposed above the mounting table 12 with a predetermined gap therebetween to face the mounting table 12; and a plasma generating device 14 provided above the collecting plate 13. The mounting table 12 mounts thereon the wafer W.

The mounting table 12 is made of an insulating material, and has therein an electrostatic electrode plate 15. The electrostatic electrode plate 15 is connected to a first DC power supply 16. When a positive DC voltage is applied from the first DC power supply 16 to the electrostatic electrode plate 15, electrons are attracted to a surface (hereinafter, referred to as a "backside") of the wafer W that faces the mounting table 12. Since, however, the mounting table 12 is made of an insulating material, the electrons remain thereon and a negative potential is generated on the backside of the wafer W.

At that time, a positive potential is generated on a surface (hereinafter, referred to as a "top surface") of the wafer W that faces the collecting plate 13 due to reaction against the electrons attracted on the backside of the wafer W. When the negative potential is generated on the backside of the wafer W, a potential difference is generated between the electrostatic electrode plate 15 and the backside of the wafer W. The wafer W is attracted and held on the mounting table 12 by Coulomb force or Johnson-Rahbek force caused by the potential difference. Besides, the mounting table 12 has therein an electric heater 17 for heating the wafer W, and the electric heater 17 is connected to a second DC power supply 18.

The collecting plate 13 is formed of a flat plate which has a thickness of about 0.5 mm to 10 mm and is made of, e.g., $Y_2O_3$, quartz, polytetrafluoroethylene (e.g., Teflon (trademark)), Si, Al, $Al_2O_3$, $SiO_2$ or the like. A surface roughness thereof is set to be greater than or equal to a predetermined value so that particles can be attached thereto.

The plasma generating device 14 is an inductively coupled plasma (ICP) generating device, and is connected to a high frequency power supply 19. The plasma generating device 14 generates a surface wave plasma from a processing gas introduced into the processing chamber 11, and fills the processing chamber 11 with the plasma. Further, the plasma generating device 14 may be, e.g., an RLSA (Radial Line Slot Antenna) microwave plasma generating device or a remote plasma generating device which generates a surface wave plasma.

When the particles attached to the surface of the wafer W are removed by the wafer dry cleaning apparatus 10, first of all, the wafer W is mounted on the top surface of the mounting table 12 and a pressure in the processing chamber 11 is adjusted to a predetermined level by a pressure control device (not shown).

Next, the wafer W is heated by the electric heater 17 to a maximum heat resistant temperature of a photoresist film formed on the wafer W, e.g., about 150° C., thereby causing thermal stress and thermophoretic force to act on the particles attached to the surface of the wafer W. Accordingly, the particles are peeled off and separated from the surface of the wafer. In other words, when the wafer is heated to about 150° C., the particles are peeled off from the wafer W by the thermal stress.

At that time, since the collecting plate 13 disposed to face the mounting table 12 is not heated, a temperature difference between the top surface of the wafer W and the collecting plate 13 increases, and a temperature gradient is generated in an atmosphere surrounding the particles attached to the wafer W. Due to the temperature gradient, the thermophoretic force directed from the top surface of the wafer W at a high temperature side to the collecting plate 13 at a low temperature side acts on the particles peeled off from the top surface of the wafer W. Accordingly, the particles move to the collecting plate 13 and then are attached to and collected by the collecting plate 13.

The thermophoretic force can be defined as follows. When a large temperature gradient is generated in a space where particles exist, the momentum of gas molecules which collide with the particles is larger at the higher temperature side than at the lower temperature side. Accordingly, the force directed from the higher temperature side to the low temperature side acts on the particles, which is referred to as the thermophoretic force. A large thermophoretic force acts when a pressure is about $1.3 \times 10$ Pa (100 mTorr) to 1.3 kPa (10 Torr). Therefore, when removing particles from the surface of the wafer, it is preferable to adjust the pressure of the processing chamber 11 to fall within the above range.

When the removal of the particles attached to the surface of the wafer W is repeatedly performed in the wafer dry cleaning apparatus 10, the number of particles attached to the collecting plate 13 increases. For that reason, the particles attached to the collecting plate 13 need to be removed.

FIGS. 2A to 2E describe a collecting plate cleaning process as a component cleaning method in accordance with the first embodiment. This process is carried out, e.g., after the cleaned wafer W is unloaded from the processing chamber 11.

Figure 2A:
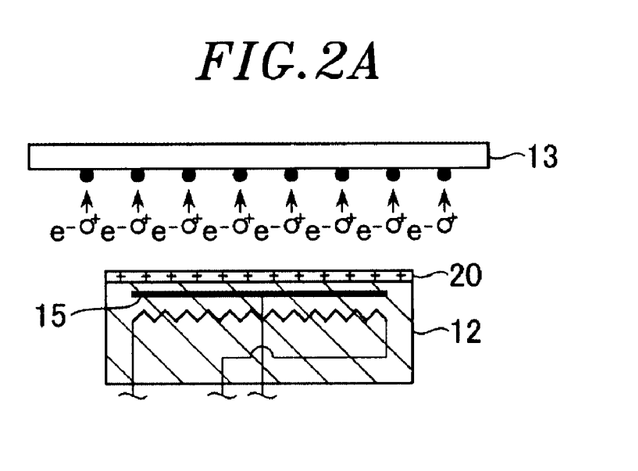
FIGS. 2A to 2E describe a collecting plate cleaning process using the component cleaning method of the first embodiment.

Referring to FIGS. 2A to 2E, first of all, a dummy wafer 20 (foreign material adsorbing member) is loaded into the processing chamber 11 and mounted on the mounting table 12. By applying a positive DC voltage from the first DC power supply 16 to the electrostatic electrode plate 15, the dummy wafer 20 is electrostatically attracted and held on the mounting table 20 (loading step). At that time, a positive potential is generated on a top surface of the dummy wafer 20 (FIG. 2A). Since the positive DC voltage is continuously applied to the electrostatic electrode plate 15 until the dummy wafer 20 is unloaded to the outside of the processing chamber 11, the positive potential is kept on the surface of the dummy wafer 20.

Then, the inside of the processing chamber 11 is depressurized by a gas exhaust unit (not shown) to a high vacuum state (e.g., about $1.3 \times 10^{-3}$ Pa ($1.0 \times 10^{-5}$ Torr) or below), and a processing gas mainly containing, e.g., Ar gas, is introduced into the processing chamber 11. Further, a surface wave plasma is generated by applying a high frequency voltage from the high frequency power supply 19 to the plasma generating device 14, and the processing chamber 11 is filled with the plasma thus generated.

In the wafer dry cleaning apparatus 10, the collecting plate 13 is positioned nearer the plasma generating device 14 than the dummy wafer 20 electrostatically attracted and held on the mounting table 12, so that the surface wave plasma is generated nearer the collecting plate 13 than the dummy wafer 20. Hence, the plasma density around the collecting plate 13 is high compared to that around the dummy wafer 20. As a result, the collecting plate 13 is easily sputtered by positive ions in the plasma (indicated by "○" in the drawing), and the particles (indicated by "●" in the drawing) attached to the collecting plate 13 are peeled off from the collecting plate 13 by the sputtering of the positive ions (FIG. 2A).

Figure 2B:
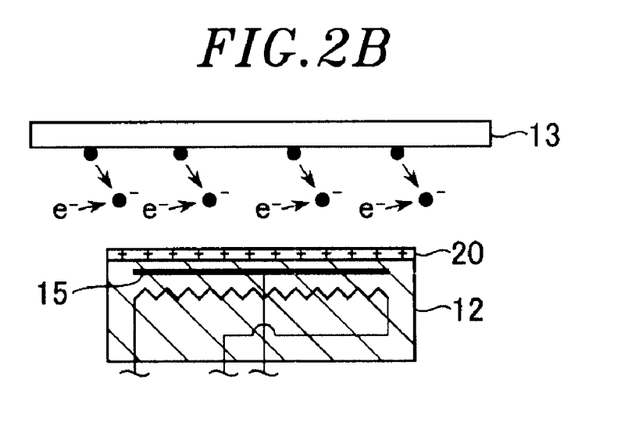

The peeled-off particles scatter in the processing chamber 11, and collide with electrons (indicated by "e$^-$" in the drawing) in the plasma. Accordingly, the particles are negatively charged and a negative potential is generated at the particles (FIG. 2B).

Figure 2C:
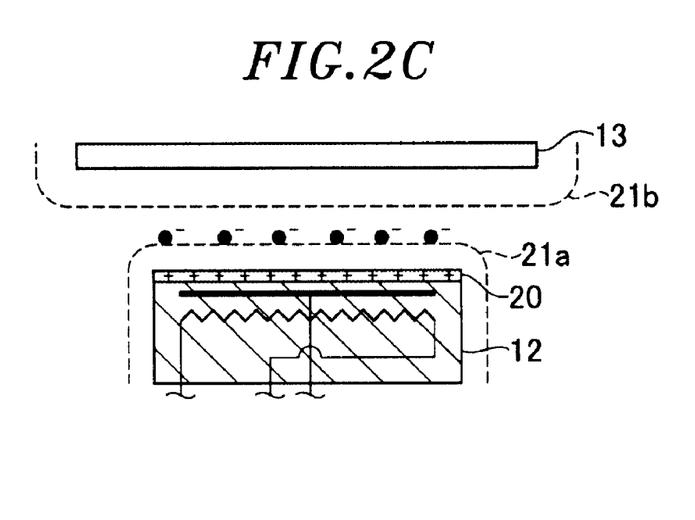

Meanwhile, while the plasma exists in the processing chamber 11, sheaths 21a and 21b are generated near the surface of the dummy wafer 20 and the surface of the collecting plate 13 due to the plasma (FIG. 2C). The sheaths are regions where an ion density is high. Specifically, the positive ions are accelerated toward the dummy wafer 20 and the collecting plate 13 by attractive electrostatic force applied thereto, but the electrons or the negatively charged particles become distant from the dummy wafer 20 or the collecting plate 13 by repulsive electrostatic force applied thereto. As a result, the negatively charged particles float in the processing chamber 11 due to the balance of the electrostatic forces from the sheaths 21a, 21b and the gravity (FIG. 2C).

Further, the positive ions are attracted to the dummy wafer 20 by the sheath 21a, so that the dummy wafer 20 is sputtered by the positive ions. Since, however, the dummy wafer 20 is distant from the plasma generating device 14, the plasma density near the dummy wafer 20 is low and the sheath 21a is thin. Therefore, the number of positive ions attracted to the dummy wafer 20 is small and the energy is also low. For that reason, the particles adsorbed on the dummy wafer 20 are hardly rescatterred by sputtering of the positive ions, as will be described later.

Next, when the generation of the surface wave plasma by the plasma generating device 14 is stopped by stopping application of a high frequency voltage from the high frequency power supply 19, the sheaths 21a and 21b are extinguished. Specifically, when the sheath 21a is extinguished, the repulsive electrostatic force caused by the sheath 21a does not act on the negatively charged particles near the sheath 21a and the particles face the top surface of the dummy wafer 20 which has a positive potential. Then, the attractive electrostatic force acts between the negatively charged particles and the positively charged top surface of the dummy wafer 20, so that the particles are attracted to and adsorbed on the dummy wafer 20 (FIG. 2D).

Figure 2D:
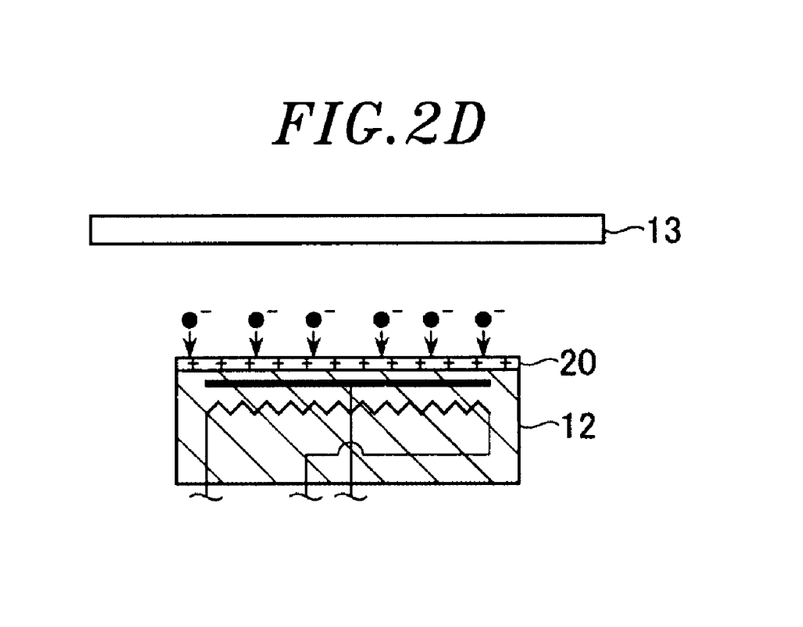
Figure 2E:
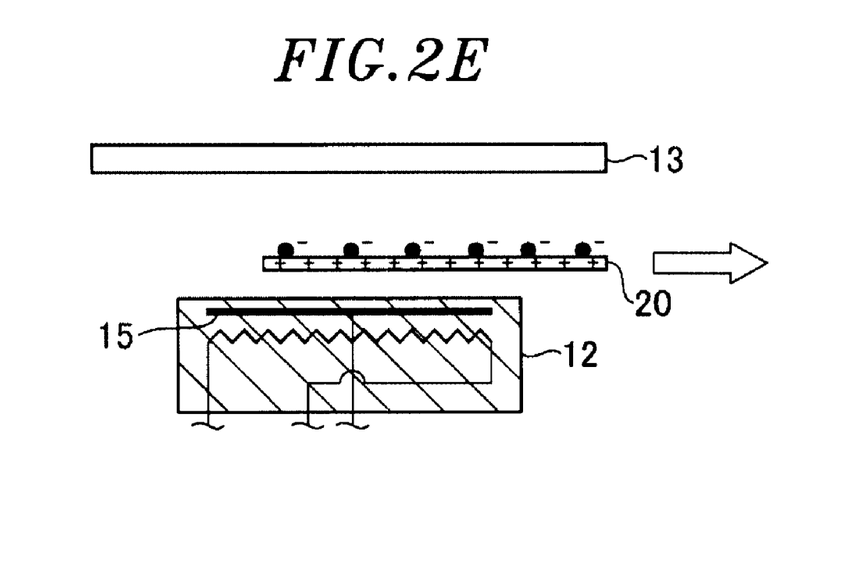

With this process, the start and the stop of the generation of the surface wave plasma by the plasma generating device 14, i.e., the peeling off of the particles from the collecting plate 13 (plasma generating step) shown in FIGS. 2A to 2C and the adsorption of the particles onto the dummy wafer 20 (plasma extinguishment step) shown in FIG. 2D, are repeated. Thus, the peeling off of the particles from the collecting plate 13 and the adsorption of the particles on the dummy wafer 20 can be reliably carried out.

Preferably, a time period (first predetermined time period) for generating a surface wave plasma by the plasma generating device 14 is enough for at least a part of the particles to be peeled off from the collecting plate 13, and a time period 14 (second predetermined time period) for stopping the generation of the surface wave plasma by the plasma generating device is enough for at least a part of the particles peeled off from the collecting plate 13 to be attracted to and arrived at the dummy wafer 20 by the electrostatic force generated by the positive potential of the dummy wafer 20.

Figure 3A:
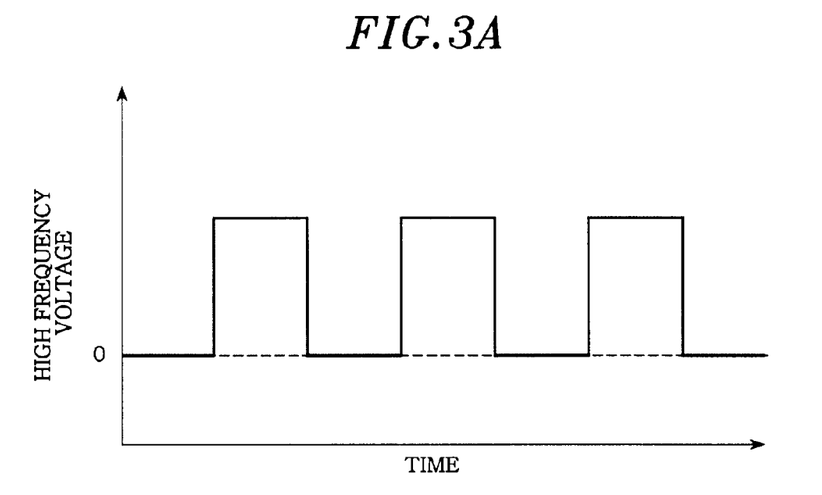

In this process, a high frequency voltage may be applied in a pulse wave. In other words, the start and the stop of the generation of the surface wave plasma by the plasma generating device 14 may be repeated in a pulse wave manner, as can be seen from FIG. 3A. In this case, when the frequency of the pulse wave is greater than or equal to, e.g., about 1 kHz, the generation of the plasma may not cease as soon as the application of the high frequency voltage to the plasma generating device 14 is stopped. Moreover, the generation of the surface wave plasma needs to be kept for a duration to sufficiently sputter the collecting plate 13 during the generation of the surface wave plasma, and the generation of the surface wave plasma needs to be stopped for a duration to reliably extinguish the sheath, in order to facilitate the adsorption of the particles onto the dummy wafer 20. Therefore, the frequency of the pulse wave is preferably low, e.g., about 10 Hz to 100 Hz.

Figure 3B:
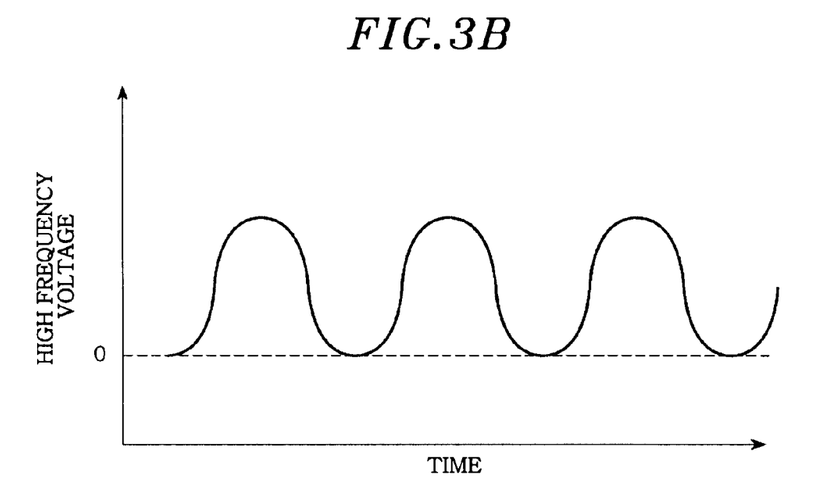
FIG. 3B shows a case where the repetition is performed in a sine wave manner.

Alternatively, the start and the stop of the generation of the surface plasma by the plasma generating device 14 may be repeated in a sine wave manner, as illustrated in FIG. 3B. In such a case, the change in the electrostatic force applied to the negatively charged particles, e.g., the change from the repulsive force to the attractive force or vise versa, can be made smoothly. Therefore, the particles can be prevented from scattering to unexpected locations because of the sudden change of the electrostatic force.

Next, the electrostatic attraction of the dummy wafer 20 is ceased by stopping the application of a positive DC voltage from the first DC power supply 16 to the electrostatic electrode plate 15. Then, the dummy wafer 20 is unloaded to the outside of the processing chamber 11 (unloading step) (FIG. 2E), thereby completing this process.

In accordance with the collecting plate cleaning process shown in FIGS. 2A to 2E, the dummy wafer 20 is loaded into the processing chamber 11 and a positive potential is generated on the top surface of the dummy wafer 20. Then, the start and the stop of the generation of the surface wave plasma nearer the collecting plate 13 than the dummy wafer 20 are repeated alternately. Thereafter, the dummy wafer 20 is unloaded from the processing chamber 11. Thus, the peeling off of the particles from the collecting plate 13 by the plasma sputtering and the adsorption of the particles on the dummy wafer 20 by the electrostatic force are repeated alternately in the processing chamber 11.

Therefore, the particles attached to the collecting plate 13 can be transferred to the dummy wafer 20 without unloading the collecting plate 13 to the outside of the processing chamber 11 while preventing the particles attached to the collecting plate 13 from being adsorbed on other components of the wafer dry cleaning apparatus 10. As a result, the collecting plate 13 can be easily cleaned while preventing the particles from being attached to other components.

In the collecting plate cleaning process of FIGS. 2A to 2E described above, the mounting table 12 is covered with the dummy wafer 20 loaded into the processing chamber 11, so that the particles peeled off from the collecting plate 13 can be prevented from being attached to the mounting table 12. Further, since the particles are adsorbed on the dummy wafer 20, the particles can be removed from the processing chamber 11 only by unloading the dummy wafer 20.

In general, the wafer dry cleaning apparatus 10 has a mechanism (not shown) for loading and unloading wafers including the dummy wafer 20 and, thus, no additional mechanism is required to remove particles.

In a conventional parallel plate plasma processing apparatus, when plasma is generated, a high frequency voltage applied to the plasma processing apparatus needs to be matched, and the matching requires a certain period of time. Therefore, if the plasma generation time is short when repeating the generation and the extinguishment of the plasma, the plasma may not be sufficiently generated.

However, in the collecting plate cleaning process shown in FIGS. 2A to 2E, the processing chamber 11 is filled with the plasma by the plasma generating device 14, e.g., an inductively coupled plasma processing device for generating surface wave plasma, so that the matching of the high frequency voltage is not required. Accordingly, even if the plasma generation time is short, the plasma can be stably generated in the processing chamber 11 and, also, the particles can be reliably peeled off from the collecting plate 13.

Figure 4A:
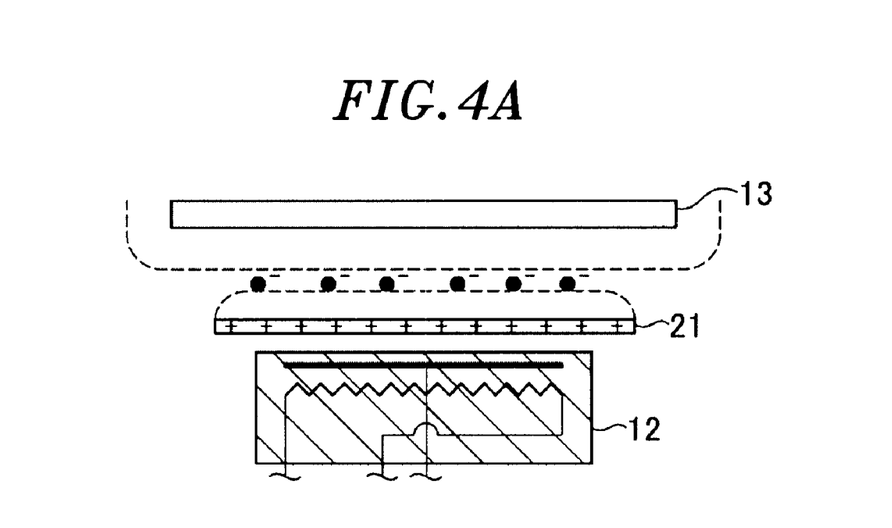
FIG. 4A is a cross sectional view in the case of using a flat plate-shaped cover as the foreign material adsorbing member.

In the collecting plate cleaning process shown in FIGS. 2A to 2E, the dummy wafer 20 is mounted on the mounting table 12 and is electrostatically attracted and held thereon. However, instead of the dummy wafer 20, there may be employed a flat cover 21 which is electrically charged to a positive potential and serves as a foreign material adsorbing member. The flat cover 21 is loaded into the processing chamber 11 and arranged to cover the mounting table 12 between the collecting plate 13 and the mounting table 12 without being mounted on the mounting table 12 (FIG. 4A).

In such a case, the negatively charged particles peeled off from the collecting plate 13 are adsorbed on the flat cover 21. Therefore, the particles can be removed from the processing chamber 11 merely by unloading the cover 21 to the outside thereof. In addition, since the mounting table 12 is covered by the cover 21, the particles peeled off from the collecting plate 13 can be prevented from being attached to the mounting table 12.

Figure 4B:
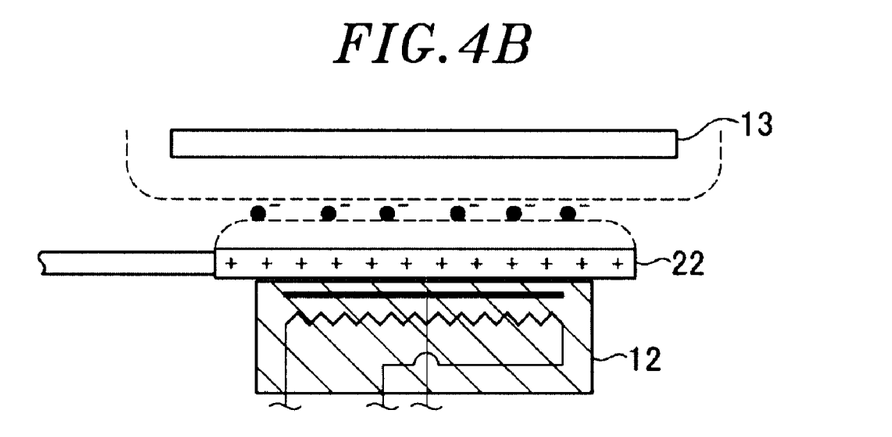
FIG. 4B is a cross sectional view in the case of using a ring-shaped member as the foreign material adsorbing member.
Figure 4C:
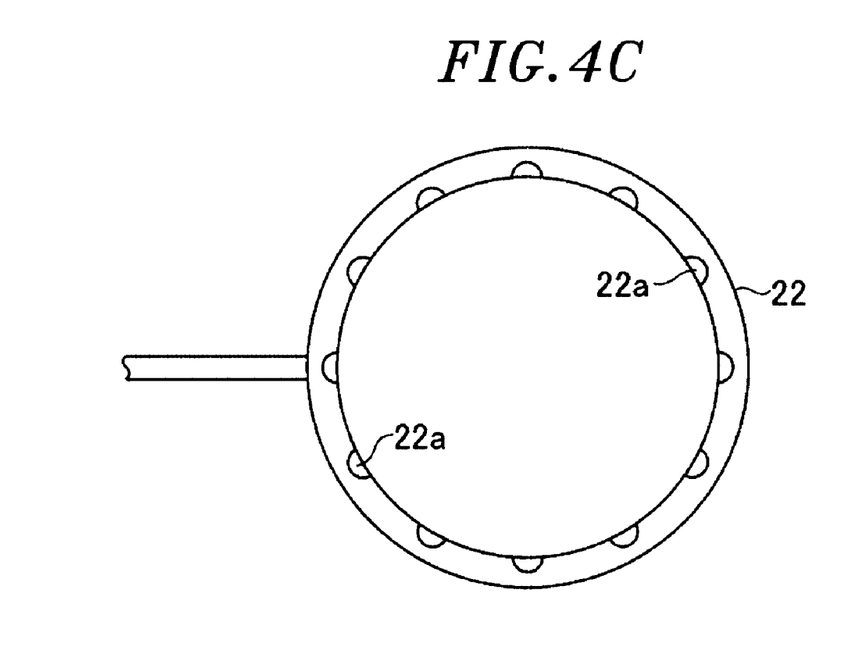
FIG. 4C is a top view schematically showing a structure of the ring-shaped member of FIG. 4B.
Figure 4D:
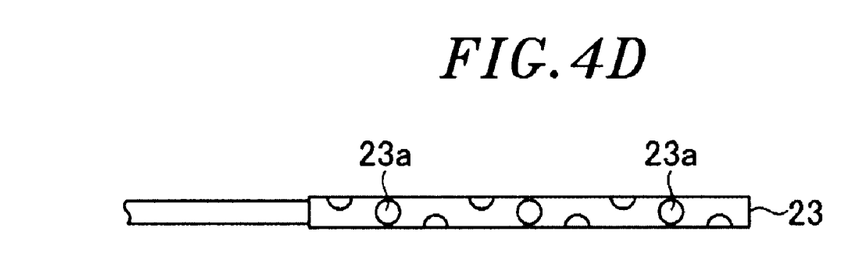
FIG. 4D is a top view schematically showing a structure of a bar-shaped member used as the foreign material adsorbing member.

Furthermore, the foreign material adsorbing member loaded into the processing chamber 11 is not limited to the cover 21. There may be used a positively charged ring-shaped member 22 as shown in FIGS. 4B and 4C, or a positively charged bar-shaped member 23 as shown in FIG. 4D, for example. In that case as well, the particles peeled off from the collecting plate 13 and negatively charged are adsorbed on the ring-shaped member 22 or the bar-shaped member 23.

The ring-shaped member 22 or the bar-shaped member 23 is preferably provided with a plurality of suction ports 22a or 23a for sucking the particles together with an atmosphere. Hence, the negatively charged particles attracted by the positive potential of the ring-shaped member 22 or the bar-shaped member 23 are sucked to be discharged to the outside of the processing chamber 11.

Figure 5A:
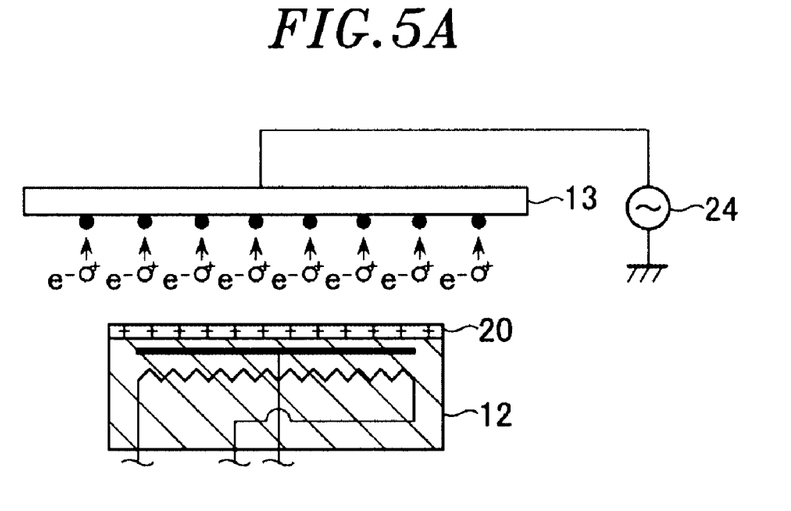
FIG. 5A is a cross sectional view showing a case of applying a bias voltage to the collecting plate.

In the collecting plate cleaning process shown in FIGS. 2A to 2E, when the particles are peeled off from the collecting plate 13 by the plasma sputtering, a bias voltage may be applied from another high frequency power supply 24 to the collecting plate 13 (FIG. 5A). In that case, the plasma can be reliably attracted to the collecting plate 13 by the bias voltage applied thereto and, here, the peeling off of the particles can be facilitated.

Moreover, when the particles are peeled off from the collecting plate 13 by the plasma sputtering, at least one of heat, impact and vibration may be applied to the collecting plate 13. Accordingly, the peeling off of the particles can be facilitated by thermal stress or impact force acting on the particles.

In the collecting plate cleaning process shown in FIGS. 2A to 2E, when the processing chamber 11 is filled with the plasma, it is preferable not to apply a bias voltage to the mounting table 12 in order to protect the dummy wafer 20 from the plasma sputtering.

Figure 5B:
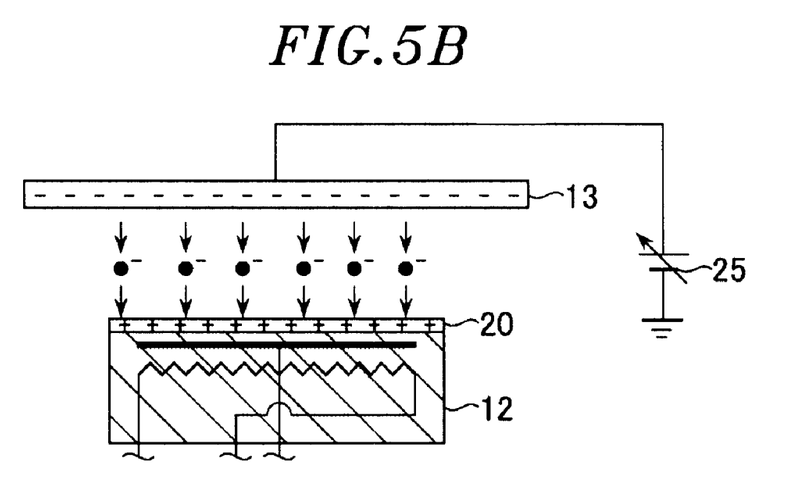
FIG. 5B is a cross sectional view illustrating a case of applying a negative DC voltage to the collecting plate.

Besides, in the collecting plate cleaning process shown in FIGS. 2A to 2E, when the particles are adsorbed on the dummy wafer 20 by the electrostatic force, the collecting plate 13 may be charged to a negative potential by applying a negative DC voltage from a third DC power supply 25 to the collecting plate 13 (FIG. 5B). In that case, the negative potential is generated on the collecting plate 13, and the repulsive electrostatic force acts on the negatively charged particles such that the particles become distant from the collecting plate 13.

Accordingly, the adsorption of the particles on the dummy wafer 20 can be facilitated and, also, the negatively charged particles can be prevented from being reattached to the collecting plate 13.

In the collecting plate cleaning process shown in FIGS. 2A to 2E, only the electrostatic force is used to adsorb the particles on the dummy wafer 20. However, thermophoretic force may also be used in addition to the electrostatic force. In that case, an electric heater 26 is embedded in the collecting plate 13 and a peltier element 27 is installed in the mounting table 12, as shown in FIG. 6.

Then, when the generation of the surface wave plasma is stopped, the collecting plate 13 is heated by the electric heater 26 and the dummy wafer 20 is cooled by the peltier element 27. Thus, a temperature gradient is generated between the collecting plate 13 and the dummy wafer 20. Due to the temperature gradient, thermophoretic force directed from the collecting plate 13 at a higher temperature side to the dummy wafer 20 at a lower temperature side acts on the particles. Accordingly, the adsorption of the particles on the dummy wafer 20 can be further facilitated.

Figure 6:
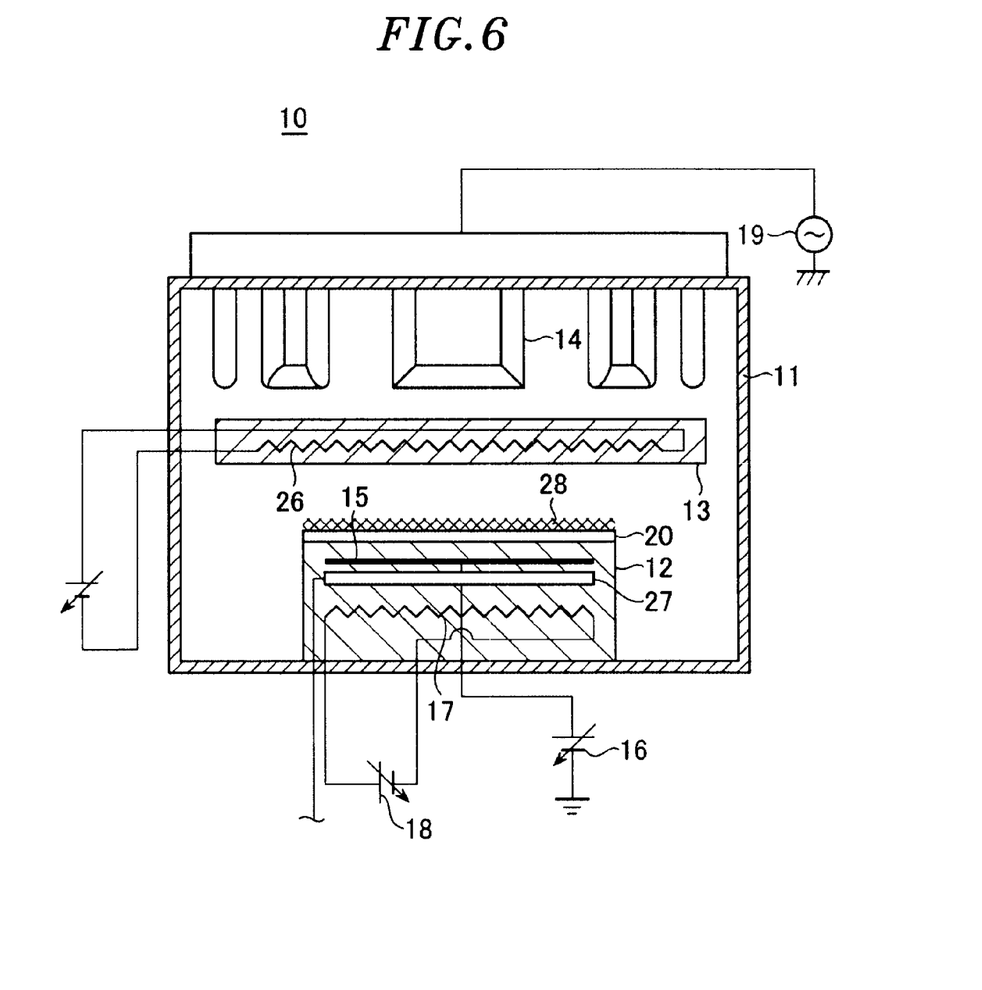
FIG. 6 represents a cross sectional view schematically showing a configuration of a modification of the wafer dry cleaning apparatus shown in FIG. 1.

Furthermore, the dummy wafer 20 may be provided with a particle capturing portion 28 for capturing particles attached to the surface thereof (FIG. 6). As for the particle capturing portion 28, it is possible to use, e.g., a mesh-shaped structure, a nonwoven fabric or an adhesive sheet having plasma resistance.

Due to the presence of the particle capturing portion 28, it is possible to prevent rescattering of the particles adsorbed on the dummy wafer 20, thereby protecting the processing chamber 11 from recontamination by the rescattered particles. At that time, in order to increase the thermophoretic force, it is preferable to adjust a pressure in the processing chamber 11 to about $1.3 \times 10$ Pa (100 mTorr) to 1.3 kPa (10 Torr).

In the collecting plate cleaning process shown in FIGS. 2A to 2E, a positive DC voltage is constantly applied to the electrostatic electrode plate 15 during the repetition of the peeling off of the particles from the collecting plate 13 and the adsorption of the particles on the dummy wafer 20. Further, a positive potential is generated on the top surface of the dummy wafer 20 during the peeling off of the particles from the collecting plate 13. However, since the negatively charged particles become distant from the dummy wafer 20 by the repulsive electrostatic force caused by the sheath 21a, the attractive electrostatic force caused by the positive potential on the top surface of the dummy wafer 20 hardly acts on the particles.

Therefore, a positive DC voltage may be applied to the electrostatic electrode plate 15 only during the adsorption of the particles on the dummy wafer 20 without being applied during the peeling off of the particles from the collecting plate 13.

Hereinafter, a component cleaning method in accordance with a second embodiment of the present invention will be explained.

Figure 7:
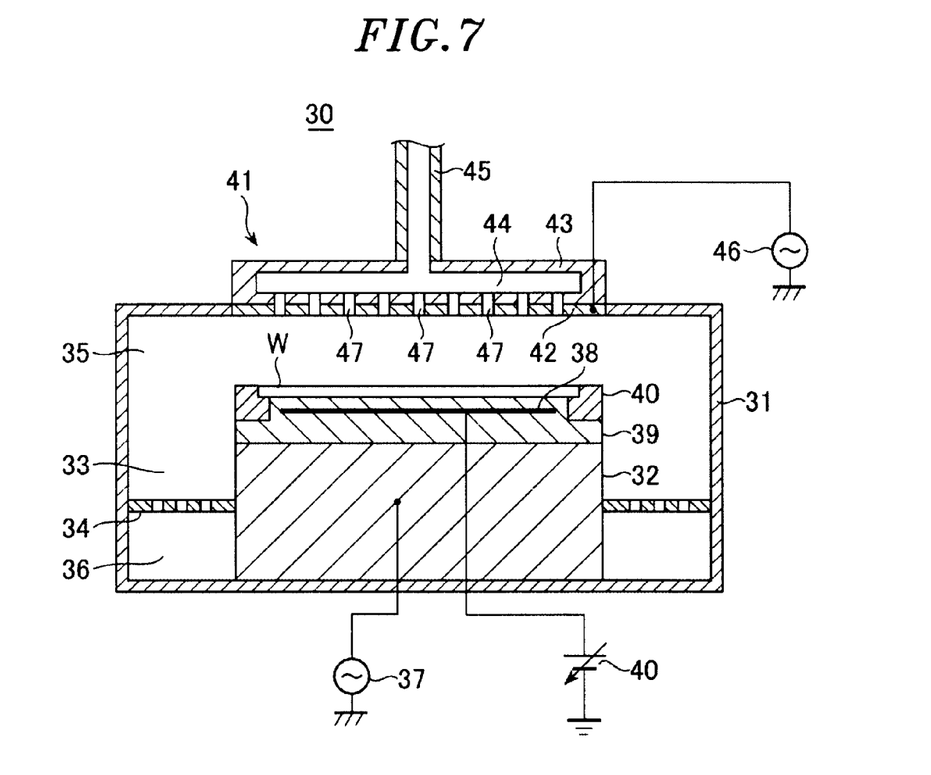
FIG. 7 offers a cross sectional view schematically depicting a configuration of a plasma etching apparatus for performing a component cleaning method in accordance with a second embodiment of the present invention.

FIG. 7 is a cross sectional view schematically showing a configuration of a plasma etching apparatus in which the component cleaning method in accordance with the second embodiment is performed. This plasma etching apparatus performs, e.g., a dry etching process, on the wafer W.

Referring to FIG. 7, a plasma etching apparatus 30 (substrate processing apparatus) includes a chamber 21 (processing chamber) for accommodating a wafer W having a diameter of, e.g., about 300 mm, and a cylindrical susceptor (mounting table) for mounting thereon the wafer W is provided at a lower portion of the chamber 31. Further, in the plasma etching apparatus 30, a side exhaust passageway 33 is formed by an inner sidewall of the chamber 31 and a side surface of the susceptor 32. A gas exhaust plate 34 is disposed in the middle of the side exhaust passageway 33.

The gas exhaust plate 34 is a plate-shaped member having a plurality of openings and serves as a partition plate for partitioning the chamber 31 into an upper part and a lower part. A plasma is generated in the upper part (hereinafter, referred to as a "reaction chamber") 35 of the processing chamber 31 which is partitioned by the gas exhaust plate 34. Further, the lower part (hereinafter, referred to as an "exhaust chamber (manifold)") 36 of the processing chamber 31 is connected to a gas exhaust unit (not shown) for exhausting a gas in the chamber 31. The gas exhaust plate 34 catches or reflects the plasma generated in the reaction chamber 35 to prevent leakage of the plasma to the manifold 36.

The gas exhaust unit depressurizes the inside of the processing chamber 31 to a high vacuum state (e.g., $1.3 \times 10^{-3}$ Pa ($1.0 \times 10^{-5}$ Torr) or below)). The pressure in the chamber 31 is controlled by a pressure control unit (not shown).

The susceptor 32 in the processing chamber 31 is connected to a first high frequency power supply 37 for applying a bias voltage to the susceptor 32. Accordingly, the susceptor 32 serves as a lower electrode.

An electrostatic chuck 39 made of an insulating member and having therein an electrostatic electrode plate 38 is disposed on the susceptor 32. A DC power supply 40 is connected to the electrostatic electrode plate 38. When a positive DC voltage is applied to the electrostatic electrode plate 38, a negative potential is generated on a surface (hereinafter referred to as a "backside") of the wafer W that faces the susceptor 32 as in the wafer dry cleaning apparatus 10, and a positive potential is generated on a surface (hereinafter referred to as a "top surface") of the wafer W which is opposite to the backside. The wafer W is attracted and held on the electrostatic chuck 39 by Coulomb force or Johnsen-Rahbek force.

An annular focus ring 40 is mounted on the electrostatic chuck 39 so as to surround the attracted and held wafer W. Due to the presence of the focus ring 40, the plasma distribution region is expanded from a space above the wafer W to a space above the focus ring 40. Accordingly, the plasma density at the peripheral portion of the wafer W is maintained at a level substantially equal to that at the central portion of the wafer W.

A showerhead 41 is disposed at a ceiling portion of the chamber 31 to face the susceptor 32. The showerhead 41 has an upper electrode 42 (component) and a cooling plate 43 that detachably holds the upper electrode 42. The upper electrode 42 is formed of a conductive disk-like shaped member having a plurality of openings 47. The cooling plate 43 has therein a buffer chamber 44 which is connected to a processing gas inlet line 45. The upper electrode 42 is connected to a second high frequency power supply 46 for applying to the susceptor 32 a high frequency voltage for plasma generation which has a relatively high frequency.

In the plasma etching apparatus 30, the processing gas supplied from the processing gas inlet line 45 into the buffer chamber 44 is introduced into the reaction chamber 35 via the gas openings 47. The introduced processing gas is excited by the high frequency voltage for plasma generation which is applied from the second high frequency power supply 46 to the reaction chamber 35 via the upper electrode 42, and is converted into plasma. The plasma is attracted to the wafer W electrostatically held on the electrostatic chuck 39 by the bias voltage applied to the susceptor 32 from the first high frequency power supply 37, thereby performing a dry etching process on the wafer W.

Operations of the components of the plasma etching apparatus 30 described above are controlled by a CPU of a control unit (not shown) provided to the plasma etching apparatus 30 based on a predetermined program.

When the dry etching process is performed by the plasma etching apparatus 30, particles and/or reaction products caused by the processing gas may be generated. Further, the repeated performance of the dry etching process may lead to attachment of the reaction products and/or the particles to each component, e.g., the upper electrode 42. Besides, if the attached particles drop on the wafer W, the semiconductor devices may become defective. For that reason, the reaction products and/or the particles attached to the upper electrode 42 need to be removed regularly.

FIGS. 8A to 8E show an upper electrode cleaning process as a component cleaning method of this embodiment. This process is carried out after, e.g., the dry etching process, is repeated a predetermined number of times.

Referring to FIGS. 8A to 8E, first of all, the dummy wafer 20 is loaded into the reaction chamber 35 and mounted on the electrostatic chuck 39. Next, a positive DC voltage is applied from the DC power supply 40 to the electrostatic electrode plate 38, so that the dummy wafer 20 is electrostatically attracted and held on the electrostatic chuck 39 (loading step).

Figure 8A:
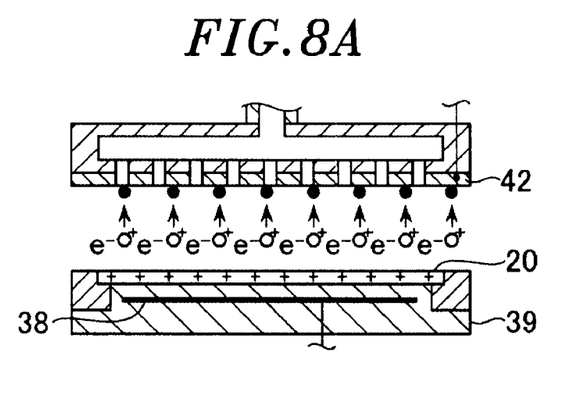
FIGS. 8A to 8E show an upper electrode cleaning process using the component cleaning method of the second embodiment.

At that time, a positive potential is generated on the top surface of the dummy wafer 20 (FIG. 8A). Further, since the positive DC voltage is continuously applied to the electrostatic electrode plate 38 until the dummy wafer 20 is unloaded to the outside of the reaction chamber 35, the positive potential is kept on the top surface of the dummy wafer 20.

Then, the inside of the reaction chamber 35 is depressurized by a gas exhaust unit to a high vacuum state (e.g., $1.3 \times 10^{-3}$ Pa ($1.0 \times 10^{-5}$ Torr) or below) and a processing gas mainly containing, e.g., oxygen gas or argon gas, is introduced into the reaction chamber 35. Moreover, a high frequency voltage for plasma generation is applied from the second high frequency power supply 46 to the reaction chamber 35 via the upper electrode 42. Accordingly, plasma containing positive ions or radicals is generated from the processing gas and the reaction chamber 35 is filled with the plasma.

In the plasma etching apparatus 30, the high frequency voltage for plasma generation is applied to the upper electrode 42, so that the plasma is generated nearer the upper electrode 42 than the dummy wafer 20 and the plasma density around the upper electrode 42 is greater than that around the dummy wafer 20.

As a result, the upper electrode 42 is easily sputtered by the positive ions (indicated by "$\bigcirc^+$" in the drawing) in the plasma, and the particles (indicated by "●" in the drawing) attached to the upper electrode 42 are peeled off from the upper electrode 42 by the sputtering of the positive ions (FIG. 8A). Further, the radicals (not shown) in the plasma easily reach the upper electrode 42, and decompose and remove the reaction products attached to the upper electrode 42.

Here, the peeled-off particles scatter in the reaction chamber 35 and collide with electrons (indicated by "$e^-$" in the drawing) in the plasma. Thus, the particles are negatively charged and a negative potential is generated at the particles (FIG. 8B).

Figure 8B:
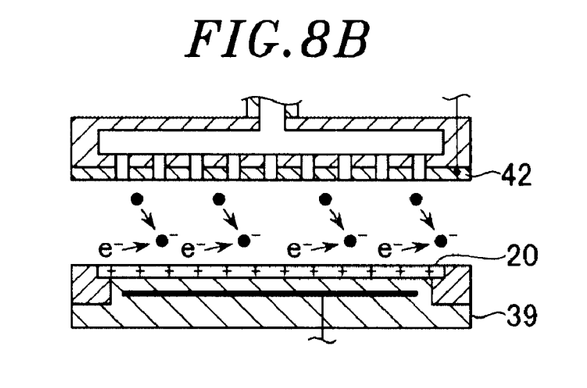
Figure 8C:
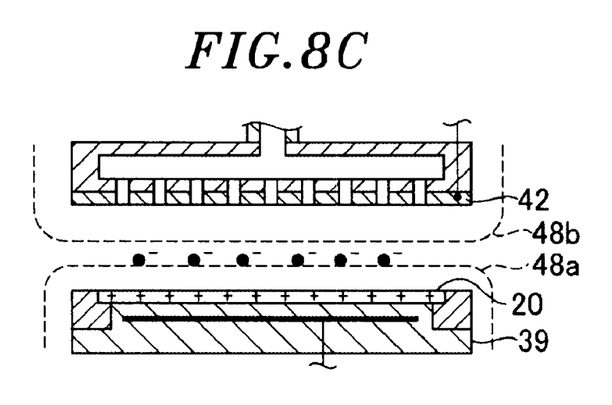

Further, when the plasma exists in the reaction chamber 35, sheaths 48a and 48b are generated near the surface of the dummy wafer 20 and the surface of the upper electrode 42 by the plasma (FIG. 8C). The negatively charged particles float in the reaction chamber 35 due to the balance of the electrostatic forces from the sheaths 48a, 48b and the gravity (FIG. 8C). Furthermore, since the sheath 48a is relatively thin for the same reason applied to the sheath 21a, the particles adsorbed on the dummy wafer 20 are hardly rescattered even by the sputtering of the positive ions.

Next, when the plasma generation is ceased by stopping application of a high frequency voltage from the second high frequency power supply 46, the sheaths 48a and 48b are extinguished. Accordingly, the negatively charged particles face the top surface of the dummy wafer 20 having a positive potential and then are attracted to and adsorbed on the dummy wafer 20 by the electrostatic force (FIG. 8D).

Figure 8D:
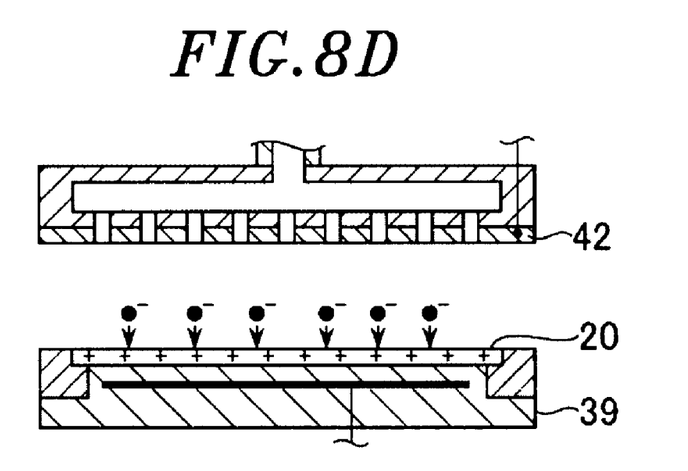
Figure 8E:
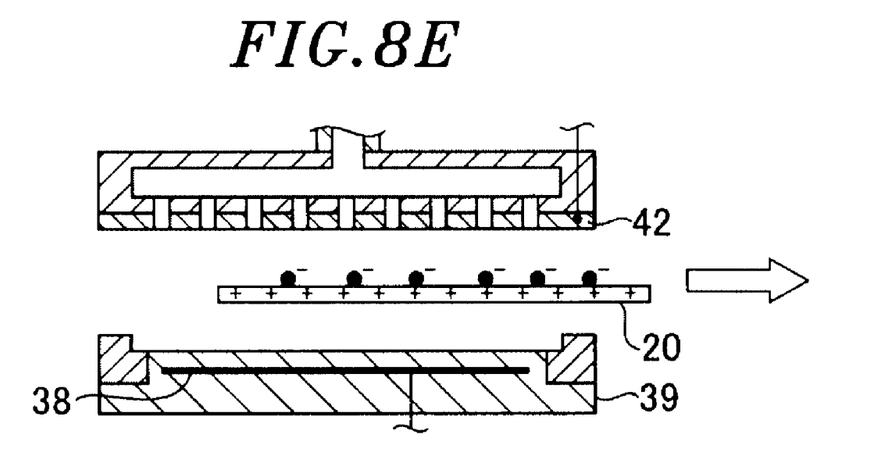

In this process as well, the generation and the extinguishment of the plasma in the reaction chamber 35, i.e., the peeling off of the particles from the upper electrode 42 (plasma generation step) shown in FIGS. 8A to 8C and the adsorption of the particles on the dummy wafer 20 (plasma extinguishment step) shown in FIG. 8D are repeated, as in the collecting plate cleaning process shown in FIGS. 2A to 2E. Accordingly, the peeling off of the particles from the upper electrode 42 and the adsorption of the particles on the dummy wafer 20 can be reliably performed.

Moreover, in this process as well, the generation and the extinguishment of the plasma is repeated in a pulse wave manner and the frequency of the pulse wave is set to about 10 Hz to 100 Hz, as in the collecting plate cleaning process shown in FIGS. 2A to 2E. Besides, in this process as well, the generation and the extinguishment of the plasma may be repeated in a sine wave manner.

Next, the electrostatic attraction of the dummy wafer 20 is ceased by stopping application of a positive DC voltage from the DC power supply 40 to the electrostatic electrode plate 38 and the dummy wafer 20 is unloaded to the outside of the chamber 31 (unloading step) (FIG. 8E), thereby completing this process.

In accordance with the upper electrode cleaning process shown in FIGS. 8A to 8E, the dummy wafer 20 is loaded into the reaction chamber 35 and a positive potential is generated on the top surface of the dummy wafer 20. Then, the generation and the extinguishment of the plasma are repeated nearer the upper electrode 42 than the dummy wafer 20. Thereafter, the dummy wafer 20 is unloaded from the reaction chamber 35.

Therefore, the particles can be transferred to the dummy wafer 20 without unloading the upper electrode 42 from the chamber 31 while preventing the particles attached to the upper electrode 42 from being adsorbed on other components in the plasma etching apparatus 30. As a result, the upper electrode 42 can be easily cleaned while preventing the particles from being attached to other components.

Moreover, the electrostatic chuck 39 is covered with the dummy wafer 20 loaded into the reaction chamber 35, so that the particles peeled off from the upper electrode 42 are prevented from being attached to the electrostatic chuck 39.

In the above-described embodiments, a substrate processed by the wafer dry cleaning apparatus 10 or the plasma etching apparatus 30 is a wafer for semiconductor devices. However, the substrate subjected to the processing is not limited to the wafer and may be, e.g., a glass substrate such as an LCD (Liquid Crystal Display), an FPD (Flat Panel Display) or the like.

Further, it is to be understood that the present invention can also be realized by supplying to computer (e.g., a control unit) a storage medium in which program codes of software that implements the functions of the aforementioned embodiments are stored, and then causing a CPU of the computer to read out and execute the program codes stored in the storage medium.

In this case, the program codes themselves read out from the storage medium realize the functions of the aforementioned embodiments and, hence, the program codes and the storage medium in which the program codes are stored fall within a scope of the present invention.

Moreover, the storage medium for supplying the program codes may be, e.g., an RAM, an NVRAM, a floppy (registered trademark) disk, a hard disk, a magnetic-optical disk, an optical disk such as a CD-ROM, a CD-R, a CD-RW, a DVD (a DVD-ROM, a DVD-RAM, a DVD-RW, a DVD+RW) or the like, a magnetic tape, a non-volatile memory card, another ROM or the like. Alternatively, the program codes may be supplied to the computer by downloading from another computer (not shown), a database or the like connected to the Internet, a commercial network, a local area network or the like.

Besides, it is to be understood that the functions of the aforementioned embodiments may be accomplished not only by executing the program codes read out by the computer, but also by causing an OS (operating system) or the like that operates on the CPU to perform a part or all of the actual operations based on instructions of the program codes.

Further, it is to be understood that the functions of the aforementioned embodiments may also be accomplished by writing the program codes read out from the storage medium into a memory provided on a function expansion board inserted into the computer or in a function expansion unit connected to the computer, and then causing the CPU or the like provided on the expansion board or in the expansion unit to perform a part or all of the actual operations based on instructions of the program codes.

The form of the program codes may be an object code, a program code executed by an interpreter, script data supplied to an OS, or the like.

While the invention has been shown and described with respect to the embodiments, it will be understood by those skilled in the art that various changes and modification may be made without departing from the scope of the invention as defined in the following claims.

What is claimed is:

1. A method for cleaning a component in a substrate processing apparatus including a processing chamber, foreign materials being attached to the component, at least a part of the component being exposed inside the processing chamber, and the substrate processing apparatus being adapted to load and unload a foreign material adsorbing member into and from the processing chamber, the method comprising:

loading the foreign material adsorbing member onto a mounting table in the processing chamber;

generating from a plasma source a plasma nearer to the component than to the foreign material adsorbing member, said component disposed above the mounting table and between the mounting table and the plasma source, to thereby peel off the foreign materials from the component by sputtering of positive ions in the plasma, the peeled-off foreign materials being negatively charged by colliding with electrons in the plasma;

extinguishing the plasma, wherein after extinguishing the plasma, the negatively charged foreign materials are adsorbed on the foreign material adsorbing member by an attractive electrostatic force between the negatively charged foreign materials and the foreign material adsorbing member; and unloading the foreign material adsorbing member from the processing chamber, wherein the generation and the extinguishment of the plasma are repeated alternately and the foreign material adsorbing member has a positive potential at least during the extinguishment of the plasma.

2. The method of claim 1, wherein the plasma is generated for a first time period and is extinguished for a second time period, the first time period being enough for at least a part of the foreign materials to be peeled off from the component by sputtering of the plasma, and the second time period being enough for at least a part of the peeled-off foreign materials to be attracted to and reach the foreign material adsorbing member by a positive potential of the foreign material adsorbing member.

3. The method of claim 1, wherein the generation and the extinguishment of the plasma are repeated in a pulse wave manner, and a frequency of the pulse wave is about 10 Hz to 100 Hz.

4. The method of claim 1, wherein the generation and the extinguishment of the plasma are repeated in a sine wave manner.

5. The method of claim 1, wherein, in said generating the plasma, the processing chamber is filled with the plasma generated by a plasma generating device for generating a surface wave plasma.

6. The method of claim 1, wherein, in said extinguishing the plasma, the component is made to have a negative voltage.

7. The method of claim 1, wherein, in said generating the plasma, a bias voltage is applied to the component.

8. The method of claim 1, wherein, in said generating the plasma, at least one of heat, impact, vibration is applied to the component.

9. The method of claim 1, wherein the foreign material adsorbing member has a foreign material capturing portion.

10. The method of claim 1, wherein the substrate processing apparatus is a substrate dry cleaning apparatus; the component is a foreign material collecting plate; and the foreign material adsorbing member is a dummy wafer, wherein the substrate dry cleaning apparatus has a mounting table provided in the processing chamber for mounting thereon the dummy wafer and the mounting table is covered with the dummy wafer loaded into the processing chamber.

11. The method of claim 1, wherein the substrate processing apparatus is a plasma etching apparatus; the component is an upper electrode; and the foreign material adsorbing member is a dummy wafer, wherein the plasma etching apparatus has a mounting table provided in the processing chamber for mounting thereon the dummy wafer and the mounting table is covered with the dummy wafer loaded into the processing chamber.

12. The method of claim 1, wherein said loading of the foreign material adsorbing member is performed after processing a plurality of substrates sequentially in the processing chamber, and the component is provided in the processing chamber while processing the substrates.

* * * * *

UNITED STATES PATENT AND TRADEMARK OFFICE
CERTIFICATE OF CORRECTION

PATENT NO. : 8,236,109 B2
APPLICATION NO. : 12/639586
DATED : August 7, 2012
INVENTOR(S) : Tsuyoshi Moriya et al.

It is certified that error appears in the above-identified patent and that said Letters Patent is hereby corrected as shown below:

IN THE SPECIFICATIONS:

Column 9, lines 38-39, insert --32-- before "(mounting table)" and after "susceptor"

Signed and Sealed this
Eighteenth Day of December, 2012

David J. Kappos
*Director of the United States Patent and Trademark Office*